United States Patent [19]

Sauer

[11] Patent Number: 5,281,805
[45] Date of Patent: Jan. 25, 1994

[54] OPTICAL-INPUT LATCH-CIRCUIT CELL ARRAY

[75] Inventor: Donald J. Sauer, Allentown, N.J.

[73] Assignee: Nippon Sheet Glass Co., Ltd., Osaka, Japan

[21] Appl. No.: 978,252

[22] Filed: Nov. 18, 1992

[51] Int. Cl.[5] .................. H01J 40/14; G02B 27/00; H03K 3/42

[52] U.S. Cl. .................. 250/214 R; 250/214 A; 250/551; 359/189; 307/311

[58] Field of Search ............. 250/214 LS, 214 R, 551, 250/214 A, 214 C, 208.1, 208.2; 377/102; 307/311, 359, 491, 356; 359/189

[56] References Cited

U.S. PATENT DOCUMENTS

| | | | |
|---|---|---|---|
| 4,853,530 | 8/1989 | Muto | 250/218 A |
| 4,935,636 | 6/1990 | Gural | 250/208.1 |
| 4,996,529 | 2/1991 | Connell | 307/359 |
| 5,010,245 | 4/1991 | Dicrikx | 250/208.1 |
| 5,045,680 | 9/1991 | Fan et al. | 250/214 LS |
| 5,055,668 | 10/1991 | French | 250/214 LS |
| 5,083,044 | 1/1992 | Mead et al. | 307/311 |

Primary Examiner—Michael Messinger
Attorney, Agent, or Firm—Ratner & Prestia

[57] ABSTRACT

An optical latch circuit is used for an optical-input section in a processor chip having a plurality of processor units each of which includes a processing section and an optical-input section. The optical input section includes a two-dimensional array, or matrix, of optical latch circuits. The optical latch circuit comprises a photodiode, coupled to a differential amplifier circuit having two CMOS circuits and a latch switch; a PMOS transistor of one of the CMOS circuits receives a control voltage from an auto-zero negative feedback circuit to produced threshold values by itself; and a PMOS transistor of the other CMOS circuit receives a control voltage from an optical-input stabilizing circuit, complementary to the auto-zero negative feedback circuit. The optical input of the photodiode is latched and amplified by turning on and off the latch switch in synchronism with the control clock, for transmission of digital electrical signals to input gates in the processing section.

7 Claims, 6 Drawing Sheets

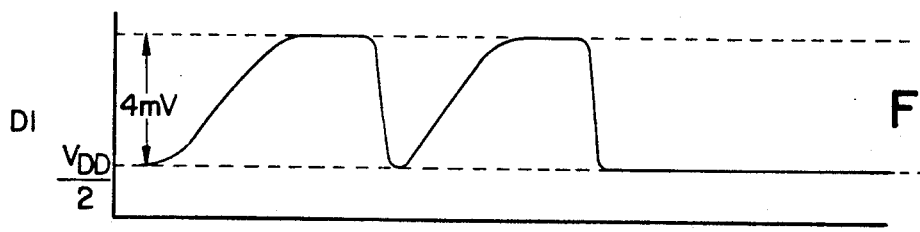
FIG. 6a
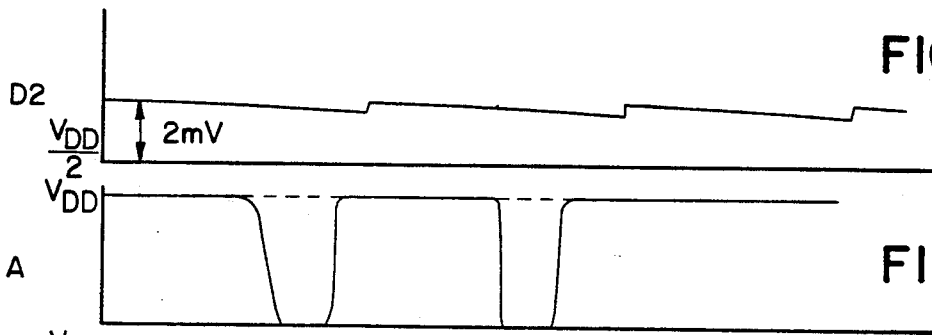
FIG. 6b
FIG. 6c
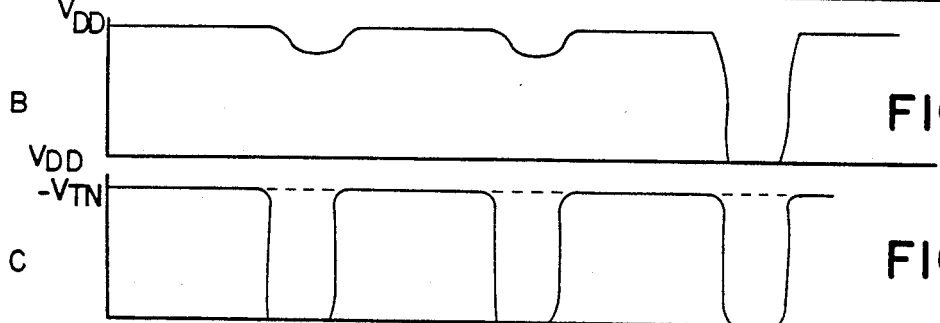
FIG. 6d
FIG. 6e
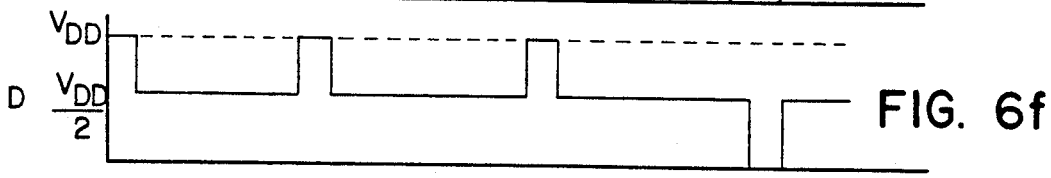
FIG. 6f
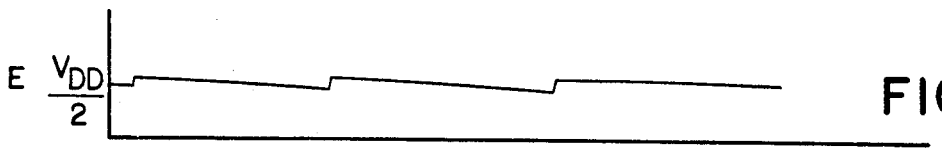
FIG. 6g
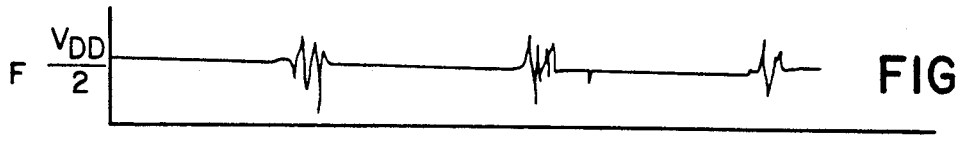
FIG. 6h
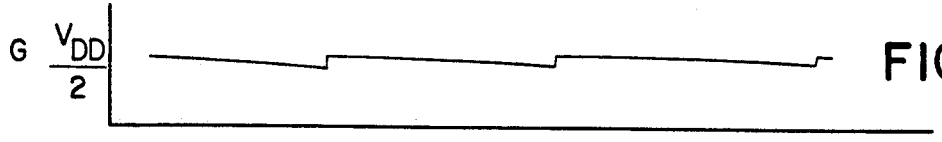
FIG. 6i FIG. 7a — LIGHT INPUT
FIG. 7b — LATCH
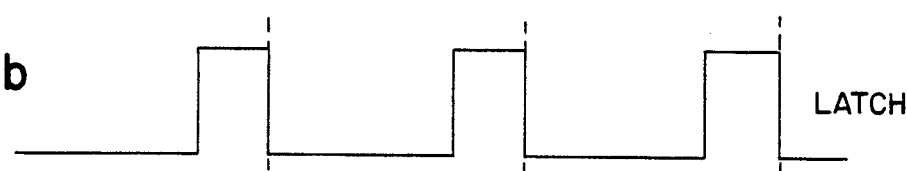
FIG. 7c — a
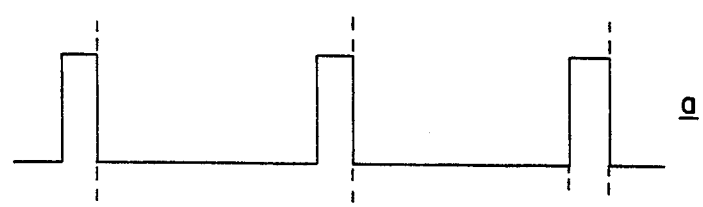
FIG. 7d — b
AUTO ZERO CYCLE
FIG. 7e — c
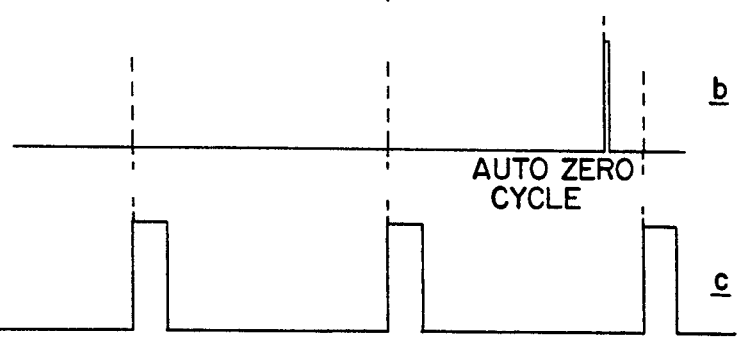

OPTICAL-INPUT LATCH-CIRCUIT CELL ARRAY

BACKGROUND OF THE INVENTION

1. Field of the Invention

This invention relates generally to an optical latch circuit, and more particularly to an optical latch circuit used in an optical-input section of a processor chip in which processing sections and optical-input sections having light-detecting elements are arranged in two-dimensional arrays. Furthermore, this invention relates to a processor unit having optical-input cell arrays in which optical-input cell elements having optical latch circuits are arranged in two-dimensional arrays.

2. Description of the Prior Art

It is well known that currently available architectures of a digital processor have a number of difficulties in further improving high-speed processing performance. Particularly pronounced is the difficulty in transferring electrical signals. These difficulties include complications caused by signal-transfer buses, and limitations in the number of input/output pins for chip packages or carriers for the parallel input of a large amount of information into a single processor chip. In order to overcome these difficulties, an optical interconnecting system has been proposed. The operating speed of a processor is drastically improved if chips in a processor system are directly interconnected optically to enable the high-speed parallel transfer of a large amount of information. One of the critical components in implementing an optical interconnecting system is a light detector that converts low level optical input signals into electrical signals at high speed. An optical interconnecting system which transfers signals between chips, desirably has a light detector with the aforementioned characteristics of converting low level optical input signals into electrical signals at high speed, and is desirably very small. A small parallel light detector does not adversely affect the area for a processing section, a register, a control section, etc. that are the key to a processor chip. In other words, it is desirable to manufacture more than 1,000 extra-small-sized parallel light-detector arrays that exceed the limit of input/output ports for the state-of-the-art processor. In addition, such arrays desirably have sufficient sensitivity and response speed to function at clock rates over the 16-MHz to 32-MHz range normally used in such processor units.

A light detector incorporated in a processor is a solid-state element relying on the internal photoelectric effect. There are two types of photodetectors generally in use, a type relying on the photoconductive effect and a type relying on the photovoltaic effect. Light detectors used to implement small-sized or arrayed devices are generally of a type using the photovoltaic effect. Such small-sized and high-speed light detectors have already been manufactured on a commercial scale through the microfabrication technologies used in the manufacture of semiconductor devices. More recently, various types of opto-electronic integrated circuits (OEICs) in which detecting and processing devices are fabricated on a single substrate have also been widely developed. To meet such varied requirements, the need has arisen to select the optimum material in accordance with the wavelength bands of light received, that is, the absorbed wavelength range of intrinsic semiconductor material, or an electron-excitation wavelength.

A light detector having a high-speed response has been developed as a component of the optical communication systems. The 0.8–1.5 $\mu$m wavelength band is widely used for optical communications because this wavelength band involves the lowest optical transmission loss in silica fibers used as a signal transmission medium. In the short-wave band (0.8 $\mu$m), silicon-pin photodiodes (Si-pin PDs) and silicon avalanche photodiodes (Si-APDs) are usually used. In the 1.3–1.5 $\mu$m band normally used for long-distance communications, Ge-pin PDs, Ge-APDs, InGaAs/GaAs-pin PDs, and InGaAs-APDs are commonly used. Generally, the factors governing the response speed of light detectors are: the speed of dispersion of electrons and holes excited by light in the active layer, and the drift mobility speed at the insulating layer. Since these characteristics are inherent to the materials used to fabricate the devices, high-speed performance of light detectors is ensured by optimizing the thicknesses of the active and insulating layers.

When the electrical characteristics of a light detector for optical communication systems are considered in terms of equivalent circuits, the delay in electron conduction caused by stray capacitance affects response speed greatly. From the viewpoint of signal delay, the equivalent-circuit characteristics of an amplifier installed in-line with the light detector is desirably taken into consideration. In order to optimize the composite resistance and capacitance of the light detector and the amplifier and to minimize variations from circuit to circuit, an OEIC system in which light detectors and amplifiers are fabricated on a single substrate is also being studied.

Another important characteristic of light detectors for optical communication systems is high sensitivity. Because optical signals that are transmitted through long-distance optical fibers are usually very weak, it is desirable to receive them correctly by suppressing noises and increasing the effective relative signal intensity. In order to receive weak optical signals correctly, light detectors having a super-lattice structure, etc. are sometimes used. A detector of this type imposes a super-lattice structure on an electron-hole separating layer to introduce the excited electrons and holes into these layers. This type of light detector prevents the recombination of the holes and electrons and effectively detects weak optical input signals. A light detector of this type, however, requires a sophisticated level of semiconductor fabrication technology.

Light detectors for optical communication systems require high-speed response (greater than one gigabit per second [Gb/s]) and high sensitivity, and they are essentially discrete elements. As a result, light detectors satisfying required characteristics are selected from among multiple discrete elements manufactured by sophisticated fabricating technology.

On the other hand, light detectors, such as the two-dimensional arrays of light-detecting elements used for video cameras, are desirably inexpensive and reliable. Consequently, the materials of light-detecting elements are chiefly Si, which can be fabricated using the most advanced technology. Since an array of light-detecting elements comprises several hundred thousand, or even as many as one million light-detecting elements, its fabrication requires stable and consistent fabricating technology. Light-detecting elements are principally of the Si-pin PD structure, which is a simple light-detecting element structure. The response speed of these light-detecting elements may be lower than that required for light detectors for optical communication systems, mostly up to several megahertz. Light-detecting elements used for video cameras, etc., which usually have human-perceptible light-wavelength bands and a wavelength resolution similar to human visual power, are capable of accurately reproducing light intensity in the perceptible range. The optical signals detected by light-detecting elements are transferred to, or retrieved from, charge-coupled devices (CCDs) or bucket brigade devices (BBDs) in the form of charge packets. In such cases, circuit capacitance, etc. seldom cause failures because of the relatively low-speed transmission.

The light detectors to be used for the aforementioned optical interconnecting systems, however, cannot be of the array structure using CCDs or BBDs to achieve high-speed parallel transmission of signals as in image sensors. In terms of high-speed optical-signal conversion performance, on the other hand, the high-speed capability of more than a Gb/s level detector is not required, but an important consideration here is to make the optical interconnecting light detectors inexpensive and in small-sized arrays.

SUMMARY OF THE INVENTION

It is an object of this invention to provide a light detector suitable for parallel high-speed transmission to be used for optical interconnecting systems between processor chips.

It is another object of this invention to provide a high-sensitivity light detector which converts weak optical input signals to robust electrical signals, which are used for optically interconnecting systems implemented in the processor chips.

It is a further object of this invention to provide a light detector that can be manufactured as an inexpensive and small-sized array, to be used for an optical interconnection system among chips.

It is still a further object of this invention to provide an optical latch circuit suitable for parallel, high-speed transmission used in the aforementioned light detector.

It is still a further object of this invention to provide an optical-input cell in which optical-input cell elements each have the aforementioned optical latch circuit and are arranged in an array.

To accomplish these objectives, the light detector of this invention comprises a light-detecting element; a differential amplifier circuit having first and second operating transistors, a differential transistor pair connected to these operating transistors, and a latch switch connected to the differential transistor pair; a first control-voltage generating circuit generating a first control voltage for the first operating transistor to which the output signal of the light-detecting element is supplied; and a second control-voltage generating circuit generating a second control voltage for the second operating transistor, which is different by a predetermined voltage from the first control voltage. The second control voltage is applied to the second operating transistor using negative feedback from the output of the second operating transistor. The first control-voltage generating circuit is a circuit complementary to the second control-voltage generating circuit. The latch switch is turned on and off synchronous with the optical-input rate to the light-detecting elements to produce amplified electrical signals from the differential amplifier circuit.

The optical latch circuit of this invention is used in the optical input section of a processor chip in which processor units having a processing section and an optical-input section with light-detecting elements are arranged in a two-dimensional array or matrix. The latch circuit comprises the differential amplifier circuit, the first control-voltage generating circuit, and the second control-voltage generating circuit, the first control-voltage generating circuit being a circuit complementary to the second control-voltage generating circuit. The latch switch is turned on and off in synchronism with a control clock in the processor unit. The optical-input signals to the light-detecting elements are latched and amplified by the differential amplifier circuit to produce electrical signals which are applied to the input gate of the processing section.

The optical latch circuit is used in an optical-input section of a processor chip. The processor units consist of a processing section and the optical-input section having a plurality of the optical latch circuits arranged in a two-dimensional array. Each optical latch circuit comprises: a light-detecting element, a differential amplifier circuit having first and second CMOS devices, and an NMOS latch switch connected to said CMOS devices. The optical latch circuit is coupled to an optical-output stabilizing circuit which generates a first control voltage on the control gate of the PMOS of said first CMOS device, wherein a voltage generated by the light-detecting element is applied to the PMOS transistor. The optical latch circuit is also coupled to an auto-zero negative feedback circuit which generates a second control voltage, that differs from the first control voltage by a predetermined voltage. This second control voltage is applied to the control gate of the PMOS transistor of the second CMOS device through negative feedback from the output terminal of the PMOS transistor of the second CMOS device; the optical-output stabilizing circuit is complementary to the auto zero negative feedback circuit. The latch is enabled by a switch which is turned on and off in synchronism with a control clock signal in said processor unit. An optical-input signal, applied to the photodiode, is latched and amplified to produce a digital electrical signal at the output terminal of said differential amplifier circuit.

CMOS devices are used to reduce power consumption and therefore heat generation, and to achieve high-speed operation.

Furthermore, a more important characteristic of the auto-zero negative-feedback circuit is that a high-sensitivity optical latch is implemented. That is, the individual optical latch circuits produce, by themselves, threshold values for determining the presence or absence of optical inputs. For example, high sensitivity is achieved by using 2 mV as the threshold value, one-half of the 4 mV signal produced by the photodiode at a light flux 500 photons. To achieve high sensitivity, it is also important to strongly attenuate high-frequency noise interference such as that from an external power supply.

BRIEF DESCRIPTION OF THE DRAWINGS

FIGS. 6a–6i are waveform diagrams of voltage versus time which show signals occurring at various portions of the optical-input cell shown in FIG. 4.

FIGS. 7a through 7e are timing diagrams of voltage versus time which show optical inputs and control signals for the optical input cell shown in FIG. 4.

DESCRIPTION OF THE EXEMPLARY EMBODIMENTS

As an embodiment of this invention, an optical-input cell array fabricated in each of 64 processor units on a chip for inputting 64 bits of optical signals in parallel into each processor unit is described in the following. In this case, a total of 4,096 bits of parallel optical inputs are transferred on a chip.

Figure 1:
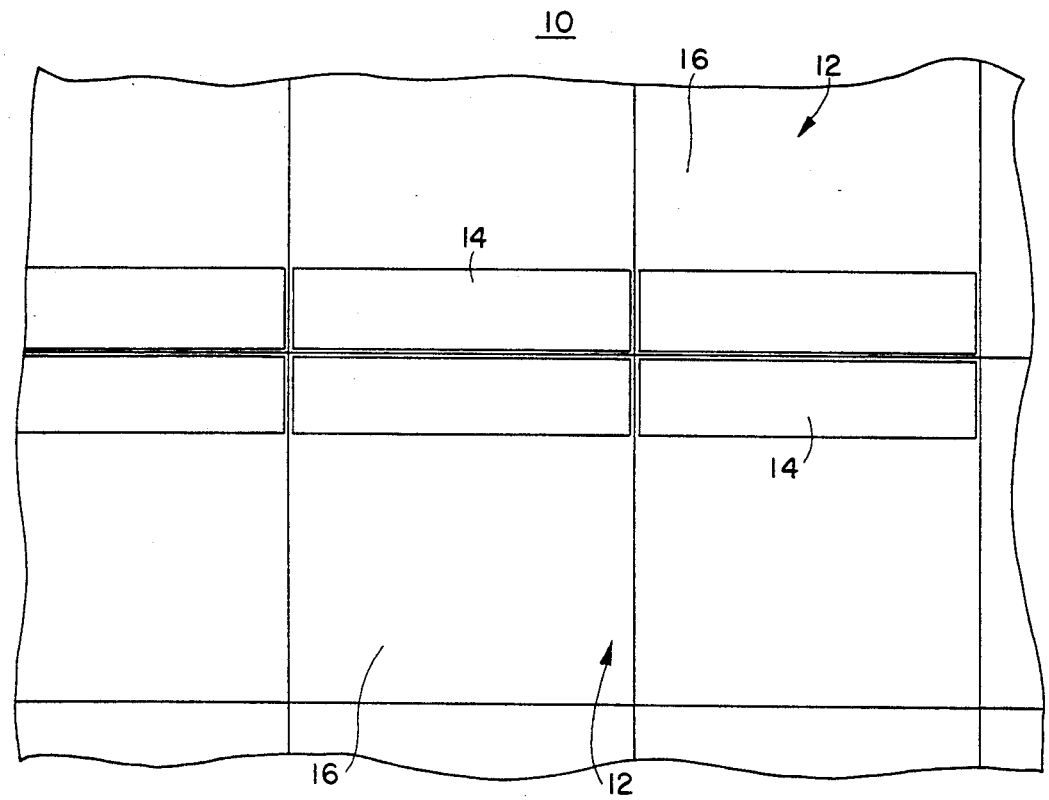
FIG. 1 is a partial plan view illustrating an example of a processor chip.

FIG. 1 is a partial plan view illustrating an example of a processor chip 10. The processor chip 10 has 64 processor units 12, each incorporating a processing section 16 and an optical-input section 14.

Figure 2:
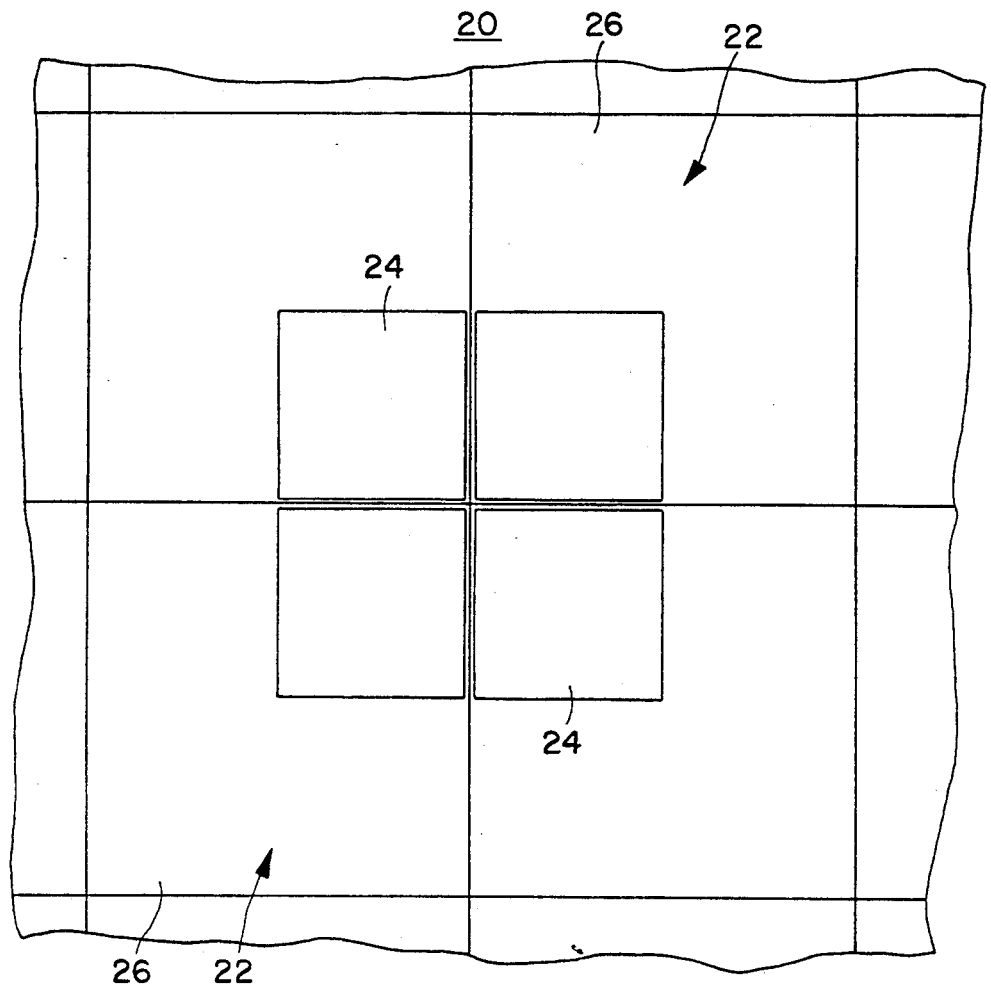
FIG. 2 is a partial plan view illustrating another example of a processor chip.

The optical-input section 14 comprises 64 optical-input cell elements. In FIG. 1, the optical-input cells 14 are arranged linearly, and adjoining vertically with each other, as shown in the figure. FIG. 2 is a partial plan view illustrating another example of a processor chip 20. Each processor unit 22 incorporates a processing section 26 and an optical-input section 24 which includes a plurality of optical-input cells. The optical-input section 24 of each processor unit 22 is arranged in such a manner that the optical input sections 24 of four adjacent processor units adjoin each other, as shown in the figure.

Each optical-input section shown in FIGS. 1 and 2 has optical-input cell elements which are approximately 100 $\mu$m square to ensure that sufficient area remains for the processing section 16 or 26.

Figure 3:
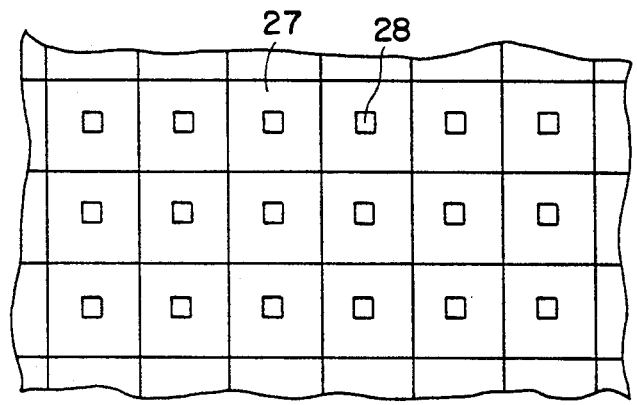
FIG. 3 is a partial plan view of an optical-input cell array.

FIG. 3 is a partial plan view of an optical-input section. This optical-input section comprises a matrix of 64 optical-input cell elements 27 each having outside dimensions of approximately 100$\mu$m$\times$100 $\mu$m, at the center of which are disposed light-detecting elements 28. An optical latch circuit is provided around the light-detecting element 28. An optical-input cell element consists of an optical latch circuit including the light-detecting element 28. Light is applied to each light detecting element 28 of the optical-input cell array at a rate of 25 MHz, and 64 bits of control signals and data signals are retrieved in parallel from the optical-input cell array.

The light-detecting element 28 is a photodiode, which generates a photovoltage of 4 mV at a light flux of 500 photons. This photodiode may be an Si-pin PD, when the substrate of the processor chip is made of Si. Alternatively, it may be a diode based on a compound semiconductor (e.g. GaAs), when the substrate of the processor chip is made of the compound semiconductor.

Figure 4:
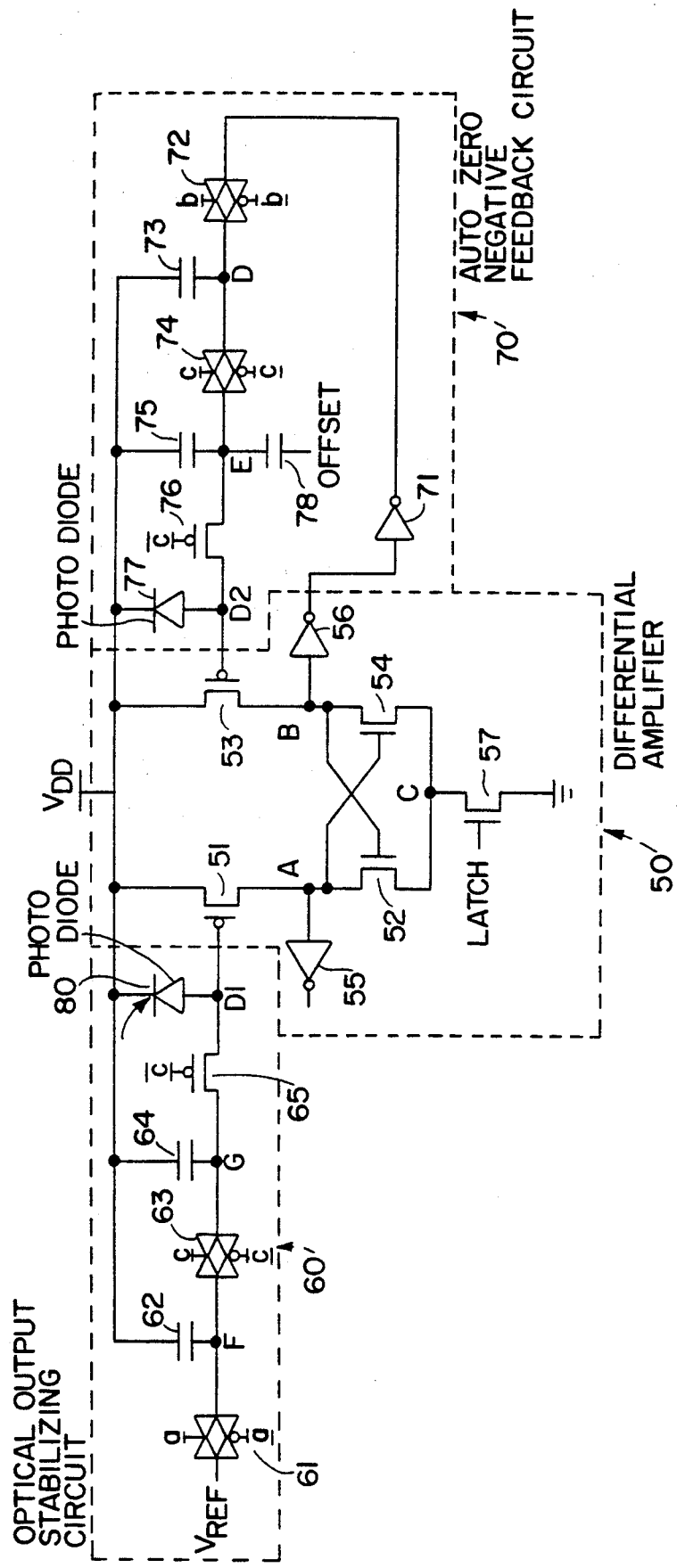
FIG. 4 is a circuit diagram of one of the optical-input cells shown in FIG. 3.

FIG. 4 is a circuit diagram of an optical latch circuit constituting an optical-input cell element. The optical latch circuit latches and amplifies the voltage generated by the photodiode at a clock rate of 25 MHz, and transfers it to the input gate of the processing section of the processor unit.

Prior to the description of the circuit shown in FIG. 4, an optical latch circuit of a simple structure will be described with reference to FIG. 5. If the electrical characteristics of all the optical latch circuits on a processor chip can be made uniform, and therefore switching threshold values for all the optical latch circuits on a processor chip can be held within an allowable range, a simple optical latch circuit as shown in FIG. 5 can satisfactorily detect optical input signals.

Figure 5:
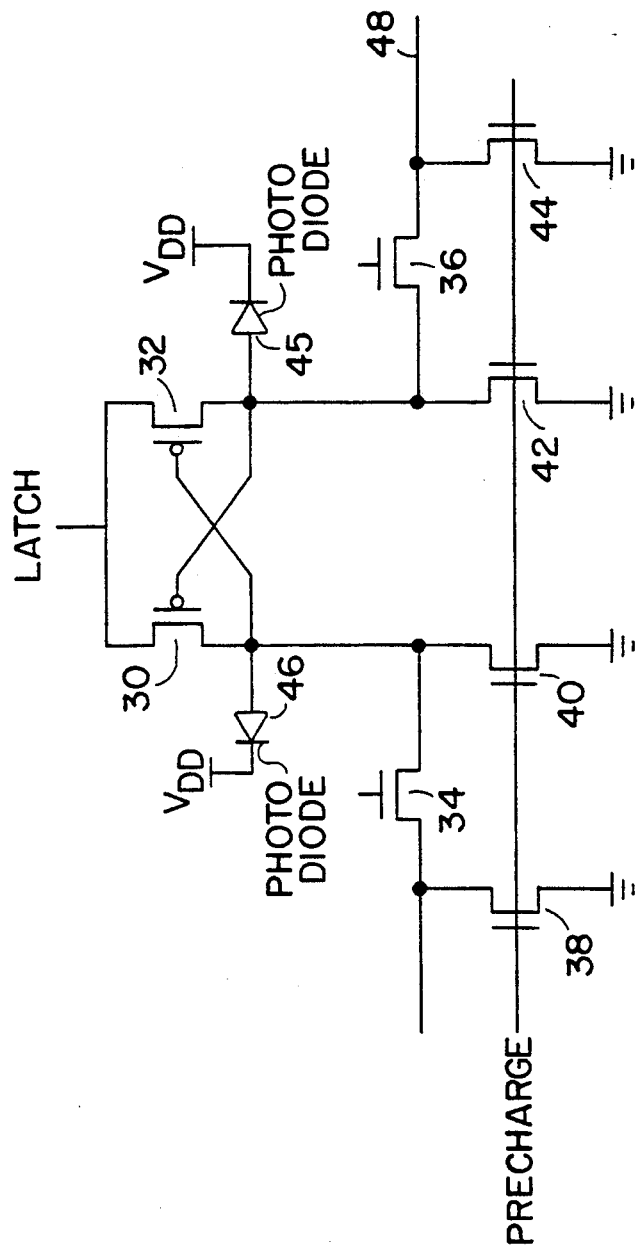
FIG. 5 is a circuit diagram of an optical latch circuit of a simple construction.

The optical latch circuit shown in FIG. 5 comprises an active photodiode 46, PMOS transistors 30 and 32, an optically masked photodiode 45, NMOS read transistors 34 and 36, and NMOS precharge transistors 38, 40, 42 and 44. The active photodiode may be either of photodiodes 45 or 46. If one selected as the active photodiode, however, the other photodiode is desirably optically masked. In this exemplary embodiment, the active photodiode 46 is provided on the side of the PMOS transistor 30 in FIG. 5.

In the optical latch circuit of such a structure, the presence or absence of optical inputs is detected by providing at the output terminal 48 the voltage of a power source, LATCH, through the read transistor 36. The conduction path from the power source LATCH to the output terminal 48 is controlled by a voltage produced by the optical input to the photodiode 46 which is applied to the gate electrode of the transistor 32. By bringing a signal PRECHARGE to the HIGH state, all the accumulated charge in the latch is discharged, and the initial state is restored (i.e. the latch is reset). The above operations are repeated every time a light input is received at the 25 MHz rate of.

The electrical characteristics of all the optical latch circuits on a processor chip cannot be made uniform, because current fabrication technology cannot realize the uniform electrical characteristics needed to implement a circuit such as that shown in FIG. 5. If a switching threshold value for any one of multiple optical latch circuits in the optical-input cell deviates from the allowable range, this results in failure of one processor unit in the processor array. That is, this processor array is considered defective. Although such defective chips can be screened out during inspection, discarding such defective chips manufactured using multiple masks will lead to decreased yield and increased overall costs.

To cope with these problems, the optical latch circuit shown in FIG. 4 is designed so that even if there are variations in electrical characteristics, the optical latch circuits can adjust themselves to create such threshold values that meet required electrical characteristics to properly detect optical inputs.

Now, the structure of the optical latch circuit shown in FIG. 4 is described in detail.

This optical latch circuit comprises a differential amplifier circuit 50, an optical-output stabilizing circuit 60, and an auto zero negative feedback circuit 70. In the figure, an active photodiode 80 is included in the optical-output stabilizing circuit 70 and an inactive or optically masked photodiode 77 is included in the auto zero negative feedback circuit.

The differential amplifier circuit 50 comprises a CMOS circuit consisting of a PMOS transistor 51 and an NMOS transistor 52, a CMOS circuit consisting of a PMOS transistor 53 and an NMOS transistor 54, inverters 55 and 56 connected to points A and B in each CMOS circuit, and a latch switch 57 which is an NMOS transistor. The transistors 52 and 54 constitute a differential transistor pair, with the gate of the transistor 54 connected to the drain of transistor 52 (point A) and the gate of the transistor 52 connected to the drain of transistor 54 (point B). The differential amplifier circuit amplifies the difference in the power source voltages between the transistors 51 and 53 by turning on the latch gate 57 in synchronism with the control clock, and provides the amplified voltage difference from the inverter 55 as its output signal.

The auto zero negative feedback circuit 70 is a circuit that automatically produces the mean-value voltage, that is, the averaged voltage, of the minimum and maximum voltages at the point B of the differential amplifier circuit 50. This circuit comprises an inverter 71, a transmission gate 72, a capacitor 73, a transmission gate 74, a capacitor 75, a switch 76, which is a PMOS transistor, and a photodiode 77. The photodiode 77 is optically masked, that is to say, it receives no light input. It is present in the circuit to match auto zero negative feedback circuit to the optical output stabilizing circuit 60. The capacitor 73 is used for generating the mean-value voltage. An offset capacitor 78 is connected to the capacitor 75. This offset capacitor is used to establish a negative offset value for the mean-value voltage. The value obtained by subtracting the offset value from the mean value is a threshold value for the transistor 53.

The optical-output stabilizing circuit 60 is complementary to the auto zero negative feedback circuit 70, which produces stabilized control voltage to the operating transistor 51 of the differential amplifier circuit 50. That is to say, the optical stabilizing circuit 60 and the auto zero negative feedback circuit have matched components in a matched configuration. This ensures that the threshold value is exceeded by the voltage generated at the gate of transistor 51 when a light pulse, representing an optical input signal, is applied to the photodiode 80.

The optical-output stabilizing circuit 60 comprises a transmission gate 61, a capacitor 62, a transmission gate 63, a capacitor 64, and a switch 65 which is a PMOS transistor. The photodiode 80 is connected between a power source $V_{DD}$ and the gate of the operating transistor 51 of the differential amplifier circuit 50. The voltage $V_{REF}$ applied to the optical-output stabilizing circuit 60 is one-half of the voltage $V_{DD}$, that is, the voltage $V_{DD}/2$, corresponding to the mean-value voltage of the maximum and minimum voltages at the point B.

Now, assume that the substrate of the processor chip on which the optical latch circuit of the above structure is fabricated is made of Si, and the photodiode 80 is an Si-pin PD, the internal capacitance of which is 10 femto farads (fF) that is within a range that does not cause delayed response due to stray capacitance, and the photovoltage is 4 mV at a light flux of 500 photons (when an optical signal having a wavelength of 780 nm is received at a bit-rate of 25 MHz).

To obtain the output voltage of the photodiode 80 as a stable quantity, the offset voltage applied to the capacitor 78 is set to ½ of the output voltage (+4 mV) of the photodiode 80 so that the voltage generated by the photodiode 80, that is, the control voltage applied to the gate of the operating transistor 51 can be lower than the control voltage of the operating transistor 53 when there is no optical input, and higher than the control voltage of the operating transistor 53 when there is an optical input. That is, the offset voltage is set to 2 mV. Consequently, the gate control voltage of the operating transistor 53 in the differential amplifier circuit 50 serves as the switching threshold value for this optical latch circuit.

Next, the operation of the optical latch circuit is described with reference to the optical latch circuit shown in FIG. 4, the voltage waveform diagrams shown in FIGS. 6a–i, and the timing diagrams of optical inputs and control signals shown in FIGS. 7a–e.

The basic function of the optical latch circuit is to convert optical-input signals entering the photodiode 80 into electrical signals, and to output digital electrical signals from the inverter 55 of the differential amplifier circuit 50. When there is an optical input to the photodiode 80, the output of the inverter 55 is in the HIGH state, while, when there is no optical input to the photodiode 80, the output of the inverter 55 is in the LOW state.

In the following, this function is described in more detail. It is assumed that optical input is changing in such a pattern as "present", "present", and "absent", at the input rate of 25 MHz, as shown in FIG. 7a. In the optical-output stabilizing circuit 60, the transmission gate 61 is turned on by the control signal a (FIG. 7c) to charge the capacitor 62. The transmission gate 63 is turned on by the control signal c (FIG. 7e), which has an ON timing that does not overlap with that of the control signal a, to move the charge accumulated in the capacitor 62 to the capacitor 64. At this time, the high-frequency variations (refer to the waveform F shown in FIG. 6h) of an external power source $V_{REF}$ (the voltage $V_{DD}/2$) are smoothed (refer to the waveform G shown in FIG. 6i) by the capacitors 62 and 64. In this way, the capacitors 62 and 64 act as low-pass filters to eliminate high-frequency noise. The transistor 65 is turned on by the control signal c, causing the control voltage of $V_{DD}/2$ to be supplied to the gate of the transistor 51 in the differential amplifier circuit 50.

The transmission gate 72 in the auto zero negative feedback circuit 70 is turned on by a pulse signal b (FIG. 7d) produced on the leading edge of the control signal a, during an auto-zero cycle which is timed to occur when there is no optical input. The transmission gate 74 is turned on by the control signal c to average the voltages generated at the connection B (FIG. 6d) of the differential amplifier circuit 50, using the capacitor 73.

As the maximum voltage at the connection B is $V_{DD}$, and the minimum voltage is 0, the averaged voltage is $V_{DD}/2$ when the statistical probability of either a high or low state for the latch during the auto-zero cycle is one-half. Due to the negative feedback loop, the average voltage at connection D2 is offset from $V_{DD}/2$ by an amount which compensates for the effective input offset of the latch due to device threshold mismatches and/or capacitive imbalance in the latch circuit when identical (i.e. no optical input) conditions are present at the connections D1 and D2. This averaged voltage is applied to the connection E (FIG. 6g). In addition, an offset voltage of +2 mV is applied to the connection E by the offset capacitor 78. The transistor 76 is turned on by the control signal c, causing the control voltage $V_{DD}/2+2$ mV to be supplied to the gate of the transistor 53 in the differential amplifier circuit 50.

In the state where the control voltage $V_{DD}/2$ is supplied to the gate of the transistor 51 in the differential amplifier circuit 50, while the control voltage $V_{DD}/2+2$ mV is applied to the gate of the transistor 53, both the transistors 51 and 53 are in the ON state. In this state, the same voltage as the power-source voltage $V_{DD}$ is supplied to both connection A (FIG. 6c) and connection B (FIG. 6d).

When the latch switch 57 is turned on responsive to the latch pulse LATCH, having trailing edge which coincides with the trailing edge of an optical input to the photodiode 80, the voltage at point C (FIG. 6e) falls from $V_{DD}$ minus the N-channel threshold voltage ($V_{TN}$) to approximately ground potential and the voltage difference loaded on the gates of the operating transistor 51 and 53 is amplified and appears across the points A and B.

That is, when there is an optical input, a voltage of +4 mV is produced in the photodiode 80. The voltage at the point D1 (FIG. 6a) becomes $V_{DD}/2+4$ mV, and the gate voltage of the transistor 51 becomes 2 mV higher than the gate voltage of the transistor 53. In this case, as the latch switch 57 synchronized with the clock is turned on, the drain currents (voltages) controlled by the gate voltages of the operating transistors 51 and 53 are amplified by the differential transistors 52 and 54, bringing the point A to the LOW (voltage 0) state, and the point B to the HIGH (voltage $V_{DD}$) state. Consequently, the output signal of the inverter 55 is brought in the HIGH state, causing a HIGH signal to be transferred to the input gate of the processing section.

Conversely, when there is no optical input, the control voltage of the operating transistor 53 becomes 2 mV higher than the control voltage of the operating transistor 51, and is amplified as the latch switch 57 is turned on, bringing the point A to the HIGH (voltage $V_{DD}$) state, and the point B to the LOW (voltage 0) state. As a result, the output signal of the inverter 55 is brought to the LOW state, causing a low signal to be transferred to the processing section input gate. The above operations are repeated every time a light pulse is received at the rate of 25 MHz.

The invention claimed is:

1. A light detector for latching and amplifying an output signal produced by a light-detecting element, said light detector comprising:
   a differential amplifier circuit having first and second operating transistors, a differential transistor pair connected to said first and second operating transistors, and a latch switch connected to said differential transistor pair, said second operating transistor having an output terminal at which a negative feedback signal is provided;
   a first control-voltage generating circuit for generating a first control voltage for said first operating transistor to which the output signal of said light-detecting element is applied; and
   a second control-voltage generating circuit for generating a second control voltage for said second operating transistor, which is different from said first control voltage by a predetermined voltage, through the negative feedback signal of the output terminal of said second operating transistor;
   said first control-voltage generating circuit being complementary to said second control-voltage generating circuit,
   said latch switch being turned on and off in synchronism with an optical-input signal applied to said light-detecting element to produce an amplified digital electrical signal from said differential amplifier circuit.

2. A light detector as set forth in claim 1 wherein said second control-voltage generating circuit produces an intermediate voltage between a maximum voltage and a minimum voltage each negatively fed back from the output of said second operating transistor, and produces said second control voltage by combining an offset voltage with said intermediate voltage.

3. An optical-input cell used for an optical-input section in a processor chip which includes a plurality of processor units wherein each of said plurality of processor units includes a processing section and wherein said optical-input section has an array of optical-input cell elements which are arranged in a two-dimensional array, each said optical-input cell element comprising:
   a light-detecting element generating an output signal;
   a differential amplifier circuit comprising first and second operating transistors, a differential transistor pair connected to said first and second operating transistors, and a latch switch connected to said differential transistor pair, said second operating transistor having an output terminal at which a negative feedback signal is provided;
   a first control-voltage generating circuit for generating a first control voltage for said first operating transistor to which the output signal of said light-detecting element is applied; and
   a second control-voltage generating circuit for generating a second control voltage for said second operating transistor, said second control voltage being different from said first control voltage by a predetermined voltage, and being provided through negative feedback from the output terminal of said second operating transistor;
   said first control-voltage generating circuit being complementary to said second control-voltage generating circuit,
   said latch switch being turned on and off in synchronism with a control clock signal in said processor unit,
   wherein an optical-input signal which is applied to said light-detecting element to produce the output signal which is latched and amplified in order to output a digital electrical signal from said differential amplifier circuit which digital electrical signal is applied to an input gate of one of said processing sections.

4. An optical-input cell as set forth in claim 3 wherein said second control-voltage generating circuit produces an intermediate voltage between a maximum voltage and a minimum voltage negatively fed back from the output terminal of said second operating transistor, and produces said second control voltage by combining said intermediate voltage and an offset voltage.

5. An optical latch circuit used for an optical-input section of a processor chip which includes a plurality of processor units wherein each of said plurality of processor units includes a processing section and wherein said optical-input section has an array of said optical latch circuits which are arranged in a matrix, each said optical latch circuit comprising:
   a light-detecting element;
   a differential amplifier circuit having a first CMOS circuit, a second CMOS circuit, and a NMOS latch switch connected to said first CMOS circuit and said second CMOS circuit;
   an optical-output stabilizing circuit for generating a first control voltage on a control gate of a PMOS transistor included in said first CMOS circuit to which a voltage generated by said light-detecting element is applied; and
   an auto-zero negative feedback circuit for generating a second control voltage, which is different from said first control voltage by a predetermined voltage, on a control gate of a PMOS transistor included in said second CMOS circuit through a negative feedback circuit coupled to an output terminal of said PMOS transistor included in said second CMOS circuit;

said optical-output stabilizing circuit being complementary to said auto-zero negative feedback circuit, said latch switch being turned on and off in synchronism with a control clock signal provided by said processor unit, wherein, when an optical-input signal is applied to said light-detecting element it is latched and amplified to produce a digital electrical signal at an output terminal of said differential amplifier circuit.

6. An optical latch circuit as set forth in claim 5 wherein said auto-zero negative feedback circuit produces an intermediate voltage between respective maximum and minimum voltages negatively fed back from the output terminal of said PMOS transistor included in said second CMOS circuit, and produces said second control voltage by combining said intermediate voltage with an offset voltage.

7. An optical-input cell in which a plurality of optical-input cell elements are arranged in a two-dimensional array, each said optical-input cell element comprising:

a light-detecting element;

a differential amplifier circuit having a first CMOS circuit, a second CMOS circuit and a NMOS latch switch connected to said first CMOS circuit and said second CMOS circuit;

an optical-output stabilizing circuit which generates a first control voltage on a control gate of a PMOS transistor included in said first CMOS circuit to which a voltage generated by said light-detecting element is applied; and an auto-zero negative feedback circuit which generates a second control voltage, that is different from said first control voltage by a predetermined voltage, on a control gate of a PMOS transistor included in said second CMOS circuit through a negative feedback circuit coupled to an output terminal of said PMOS transistor included in said second CMOS circuit;

said optical-output stabilizing circuit being complementary to said auto-zero negative feedback circuit.

* * * * *